(12) United States Patent
Chen

(10) Patent No.: US 9,583,694 B2
(45) Date of Patent: Feb. 28, 2017

(54) PATTERN FORMATION METHOD, MANUFACTURING METHOD OF PEIZOELECTRIC FILM AND MANUFACTURING METHOD OF PIEZOELECTRIC ELEMENT

(71) Applicant: Xianfeng Chen, Kanagawa (JP)

(72) Inventor: Xianfeng Chen, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 353 days.

(21) Appl. No.: 14/479,639

(22) Filed: Sep. 8, 2014

(65) Prior Publication Data

US 2015/0068673 A1 Mar. 12, 2015

(30) Foreign Application Priority Data

Sep. 12, 2013 (JP) .................................. 2013-189668

(51) Int. Cl.
*B32B 37/06* (2006.01)
*H01L 41/29* (2013.01)
(Continued)

(52) U.S. Cl.
CPC .............. *H01L 41/29* (2013.01); *B41J 2/161* (2013.01); *B41J 2/1629* (2013.01); *B41J 2/1631* (2013.01);
(Continued)

(58) Field of Classification Search
CPC ..... H01L 41/277; H01L 41/297; B32B 37/06; B32B 38/0036
See application file for complete search history.

(56) References Cited

U.S. PATENT DOCUMENTS

2002/0126185 A1* 9/2002 Murai ................. B41J 2/14233
347/68
2009/0053478 A1 2/2009 Sakashita
(Continued)

FOREIGN PATENT DOCUMENTS

JP 64-072163 3/1989
JP 02-250222 10/1990
(Continued)

OTHER PUBLICATIONS

H. Suzuki et al., "Micro-patterning of sol-gel-derived PZT thin film with SAM," Ceramics International 30, pp. 1811-1813, 2004.

*Primary Examiner* — Daniel McNally
(74) *Attorney, Agent, or Firm* — Cooper & Dunham LLP

(57) ABSTRACT

A pattern formation method includes forming an electromagnetic wave blocking structure having a region on a one side of a support substrate, a reflectance of an electromagnetic wave in the region being lower than a reflectance in an area outside the region; forming a mask layer provided with an opening corresponding to the region and configured to be thermally decomposed at a predetermined temperature on an other side of the support substrate; forming a first heated layer in the opening; and shedding an electromagnetic wave from the one side of the support substrate on the electromagnetic wave blocking structure, wherein an intensity of the electromagnetic wave is determined such that a temperature of the mask layer is less than the predetermined temperature and a temperature of the first heated layer being heated is greater than or equal to the predetermined temperature.

16 Claims, 14 Drawing Sheets

(51) Int. Cl.
  *B41J 2/16* (2006.01)
  *H01L 41/318* (2013.01)
  *H01L 41/331* (2013.01)
  *H01L 41/047* (2006.01)
  *H01L 41/09* (2006.01)

(52) U.S. Cl.
  CPC .......... *B41J 2/1634* (2013.01); *B41J 2/1642* (2013.01); *B41J 2/1645* (2013.01); *B41J 2/1646* (2013.01); *H01L 41/318* (2013.01); *H01L 41/331* (2013.01); *H01L 41/0478* (2013.01); *H01L 41/0973* (2013.01)

(56) References Cited

U.S. PATENT DOCUMENTS

2012/0026249 A1* 2/2012 Kihira ..................... B41J 3/407
  347/68
2014/0216643 A1  8/2014 Chen

FOREIGN PATENT DOCUMENTS

| JP | 2001-291666 | 10/2001 |
| JP | 2007-015377 | 1/2007 |
| JP | 2012-045539 | 3/2012 |
| JP | 2013-055174 | 3/2013 |
| JP | 2014-154581 | 8/2014 |

* cited by examiner

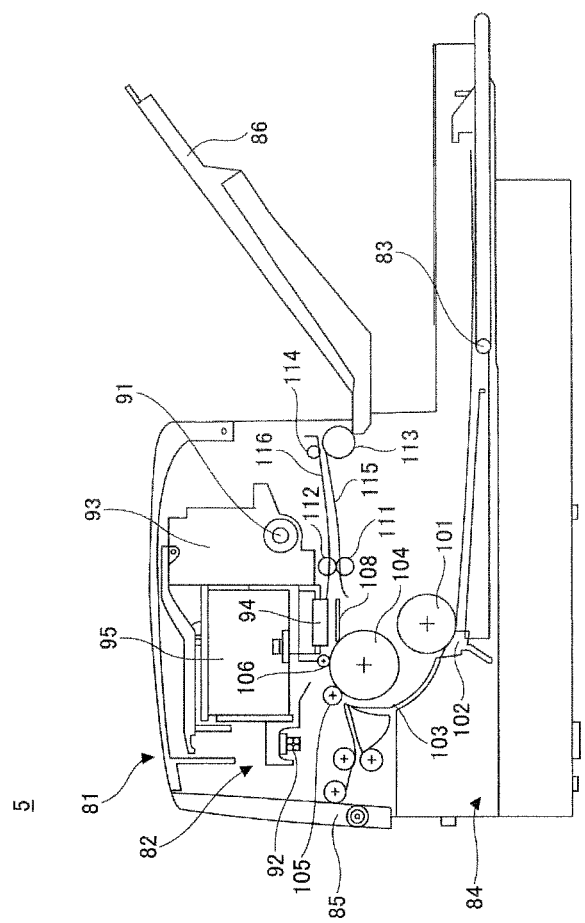

PATTERN FORMATION METHOD, MANUFACTURING METHOD OF PEIZOELECTRIC FILM AND MANUFACTURING METHOD OF PIEZOELECTRIC ELEMENT

BACKGROUND OF THE INVENTION

1. Field of the Invention

The disclosures herein generally relate to a pattern formation method, a manufacturing method of a piezoelectric film and a manufacturing method of a piezoelectric element.

2. Description of the Related Art

Some ink jet recording apparatuses or liquid drop discharging head used as image recording apparatuses or image forming apparatus such as printers, facsimile machines or copiers including piezoelectric elements are known. The piezoelectric element, for example, has a structure laminating a piezoelectric film and an upper electrode on a lower electrode.

In order to form a piezoelectric film having a desired pattern, for example, a pattern of a hydrophobic film (for example, an SAM (self-assembled monolayer) film) is formed on the lower electrode (first process). A part on the lower electrode where the pattern of the hydrophobic film is not formed is hydrophilic.

Next, only in the hydrophilic part on the lower electrode (the part where the pattern of the hydrophobic film is not formed) a precursor coated film of a piezoelectric film in an amorphous state (non-crystalline state) is formed, and a heat treatment is performed to form a crystallized film (second process). Here, the pattern of the hydrophobic film used in the first process has a property which is thermally decomposed and eliminated at a predetermined temperature, and since a temperature for crystallizing the precursor coated film in the second process is higher than the predetermined temperature for the thermal decomposition for the hydrophobic film, by the heat treatment in the second process the hydrophobic film is thermally decomposed and eliminated.

Since the precursor film of the piezoelectric film is thin, a crystallized film having a predetermined thickness cannot be formed by a single process. Accordingly, by repeating the first process and the second process for a necessary number the thin crystallized films are laminated, and a thick crystallized film (a piezoelectric film having a desired thickness) is manufactured (See, for example, "Micro-patterning of sol-gel-derived PZT thin film with SAM", H. Suzuki, T. Mori, T. Fujinami, T. Ota, M. Fuji and M. Takahashi, Ceramics International, 30, 1811-1813 (2004), and Japanese Published Patent Application No. 2013-55174)

However, since the pattern of the hydrophobic film is eliminated in the second process, the pattern of the hydrophobic film is newly formed with each repetition of the first and the second processes, and the manufacturing processes become complicated.

SUMMARY OF THE INVENTION

It is a general object of at least one embodiment of the present invention to provide a pattern formation method and a manufacturing method of a piezoelectric film and a piezoelectric element that substantially obviate one or more problems caused by the limitations and disadvantages of the related art.

In one embodiment, a pattern formation method includes forming an electromagnetic wave blocking structure having a region on a one side of a support substrate, a reflectance of an electromagnetic wave in the region being lower than a reflectance in an area outside the region; forming a mask layer provided with an opening corresponding to the region and configured to be thermally decomposed at a predetermined temperature on an other side of the support substrate; forming a first heated layer in the opening; and shedding an electromagnetic wave from the one side of the support substrate on the electromagnetic wave blocking structure, wherein an intensity of the electromagnetic wave is determined such that a temperature of the mask layer is less than the predetermined temperature and a temperature of the first heated layer being heated is greater than or equal to the predetermined temperature.

In another embodiment, a manufacturing method of a piezoelectric film includes forming an electromagnetic wave blocking structure having a region on a one side of a support substrate, a reflectance of an electromagnetic wave in the region being lower than a reflectance in an area outside the region; forming a lower electrode which is an electromagnetic wave absorption layer on an other side of the support substrate; forming a mask layer provided with an opening corresponding to the region and configured to be thermally decomposed at a predetermined temperature on the lower electrode; forming a complex oxide film, which is a piezoelectric film, in the opening on the lower electrode; changing a crystalline characteristic of the complex oxide film by shedding an electromagnetic wave from the one side of the support substrate on the electromagnetic wave blocking structure such that a temperature of the mask layer is less than the predetermined temperature and a temperature of the complex oxide film is greater than or equal to the predetermined temperature to form a heat distribution in the lower electrode, and transferring the heat distribution to the complex oxide film; and increasing a film thickness of the complex oxide film by repeating the forming of the complex oxide film and the changing of the crystalline characteristic of the complex oxide film.

In yet another embodiment, a manufacturing method of a piezoelectric element includes forming an electromagnetic wave blocking structure having a region on a one side of a support substrate, a reflectance of an electromagnetic wave in the region being lower than a reflectance in an area outside the region; forming a lower electrode which is an electromagnetic wave absorption layer on an other side of the support substrate; forming a mask layer provided with an opening corresponding to the region and configured to be thermally decomposed at a predetermined temperature on the lower electrode; forming a complex oxide film, which is a piezoelectric film, in the opening on the lower electrode; changing a crystalline characteristic of the complex oxide film by shedding an electromagnetic wave from the one side of the support substrate on the electromagnetic wave blocking structure such that a temperature of the mask layer is less than the predetermined temperature and a temperature of the complex oxide film is greater than or equal to the predetermined temperature to form a heat distribution in the lower electrode, and transferring the heat distribution to the complex oxide film; increasing a film thickness of the complex oxide film by repeating the forming of the complex oxide film and the changing of the crystalline characteristic of the complex oxide film; and forming an upper electrode on the complex oxide film.

According to the present invention, a pattern formation method that forms a desired pattern with a simple manufacturing process is provided.

BRIEF DESCRIPTION OF THE DRAWINGS

Other objects and further features of embodiments will be apparent from the following detailed description when read in conjunction with the accompanying drawings, in which:

FIG. 15 is a side view illustrating an example of a mechanical section of the ink jet recording apparatus according to the eighth embodiment.

DESCRIPTION OF THE PREFERRED EMBODIMENTS

Figure 1A:
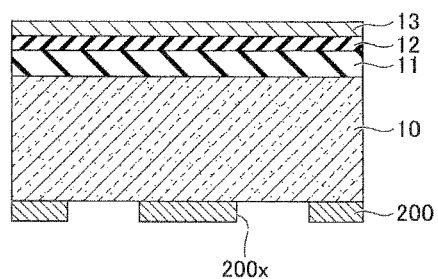
FIGS. 1A to 1C are cross-sectional diagrams for explaining an example of a pattern formation method according to a first embodiment.

In the following, embodiments of the present invention will be described with reference to the accompanying drawings. Meanwhile, to the same members or the like, the same reference numerals are assigned and a duplicate explanation may be omitted.

First Embodiment

In a first embodiment, a case where a silicon substrate is used as an example of a support substrate is illustrated and a case where a laser light is used as an example of an electromagnetic wave is illustrated, but it is not limited to them. Moreover, as a matter of convenience, a side of the support substrate where an electromagnetic wave blocking layer is formed may be called "one side" (rear surface) and a side of the support substrate where an electromagnetic wave absorption layer is formed may be called "another side" (top surface).

Figure 1B:
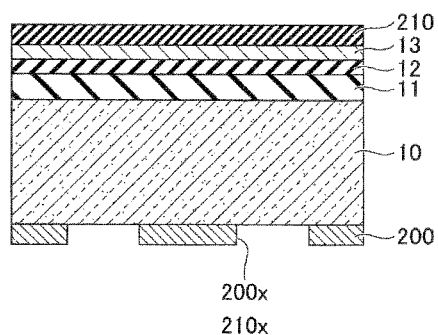
Figure 1C:
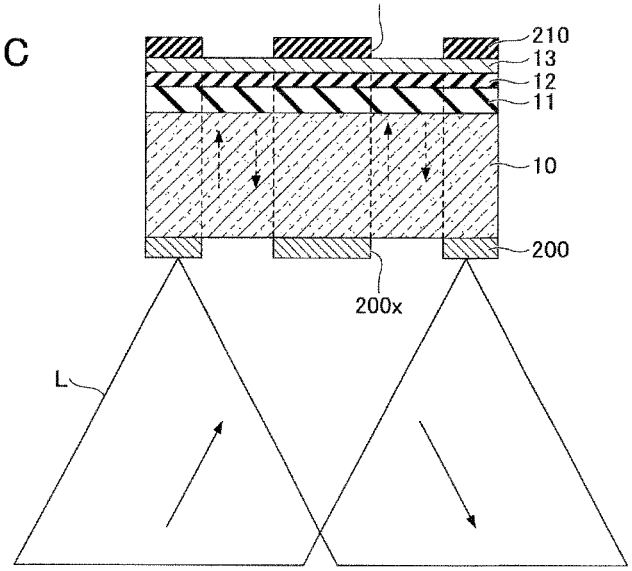

FIGS. 1A to 1C are cross-sectional diagrams for explaining a pattern formation method according to the first embodiment. At first, in a process shown in FIG. 1A, a silicon substrate 10 having a thickness of about 500 µm as a support substrate is prepared. And, on a top surface side (the another side) of the silicon substrate 10, a silicon oxide film ($SiO_2$ film) 11, a titanium oxide film ($TiO_x$ film) 12 and a platinum film 13 (Pt film) are laminated in series.

Specifically, on a surface of the silicon substrate 10, a silicon oxide film 11 having a film thickness of about 600 nm is formed, for example, by the CVD (Chemical Vapor Deposition) method, the thermal oxidization method or the like. And on the silicon oxide film 11, a titanium oxide film 12 having a film thickness of about 50 nm is formed, for example, by the sputtering method, the CVD method or the like. Furthermore, on the titanium oxide film 12, a platinum film 13 having a film thickness of about 100 nm is formed, for example, by the sputtering method, the CVD method or the like.

Meanwhile, the platinum film 13 has a function as an electromagnetic wave absorption layer that absorbs an electromagnetic wave shed from a rear surface side (one side) of the silicon substrate 10 and heats a layer to be heated (an amorphous PZT film or the like) formed on the platinum layer 13. Accordingly, the platinum film 13 is formed necessarily on a lower layer side of the layer to be heated.

Moreover, on the rear surface side of the silicone substrate 10, an electromagnetic wave blocking layer having an opening 200x (first opening) is formed. Specifically, on the whole rear surface of the silicon substrate 10, for example, by the sputtering method, the vacuum evaporation method or the like, the electromagnetic wave blocking layer 200 is formed. And the electromagnetic wave blocking layer is partially removed by the photolithography method, etching method or the like, and the opening 200x is formed.

For a material of the electromagnetic wave blocking layer 200, any material may be used as long as a transmittance for the electromagnetic wave shed from the rear surface side of the silicon substrate 10 is low (a material having a light shielding function). For the material of the electromagnetic wave blocking layer 200, for example, a metal such as chromium (Cr) may be used. The film thickness of the electromagnetic wave blocking layer 200 may be, for example, about 200 nm. Meanwhile, for the material of the electromagnetic wave blocking layer, nickel (Ni), platinum (Pt), rhodium (Rh) or the like may be used instead of chromium (Cr).

Next, in the process shown in FIG. 1B, on the platinum film 13, an SAM film 210 (Self Assembled Monolayer film) is formed. Specifically, by the spin coat method, the dispenser method or the like, on the whole surface of the platinum film 13, for example, 1H,1H,2H,2H-perfluorodecanethiol (PFDT) is attached, and the SAM film 210 is formed.

By using $CH_3(CH_2)_6$—SH for alkanethiol, and immersing, for example, in a solution of a concentration of 0.01 mol/liter (solvent: isopropyl alcohol), the SAM film 210 may be formed. The alkanethiol has a different reactivity or hydrophoby (hydrophily) according to a chain length of molecule, but may be prepared by dissolving molecules from $C_6$ to $C_{18}$ in general organic solvent (alcohol, acetone, toluene or the like). Normally, the concentration of the alkanethiol is about a few mol/liter.

Next, in the process shown in FIG. 1C, an electromagnetic wave is shed on the SAM film 210 from the rear surface side of the silicone substrate 10 via the electromagnetic wave blocking layer 200, a heat distribution is formed, a part of the SAM film 210 is removed, and it performs a patterning for the SAM film in a shape corresponding to the electromagnetic wave blocking layer 200. Meanwhile, in the present embodiment, as the electromagnetic wave a laser light L of a continuous oscillation is selected, and the laser light L of the continuous oscillation is shed via the electromagnetic wave blocking layer 200.

The laser light L shed on a region other than the opening 200x goes hardly through the electromagnetic wave blocking layer 200, but only the laser light L shed in the opening 200x goes through the silicon substrate 10, the silicon oxide film 11, and the titanium oxide film 12, and reaches the platinum film 13. That is, the laser light L is locally shed in the region corresponding to the opening 200x of the platinum film 13. Here, "corresponding to the opening 200x" means approximately overlapping with the opening 200x viewed from in a direction normal to the surface of the silicon substrate on which the electromagnetic wave blocking layer 200 is formed.

Meanwhile, broken lines and broken arrows in FIG. 1C illustrate the laser light L which goes through the silicon substrate 10, the silicon oxide film 11 and the titanium oxide film and is partially reflected on the platinum film 13 (it will be the same in the following drawings). In FIG. 1C, the laser light L is shed on the electromagnetic wave blocking layer 200 obliquely, but the laser light L may be shed on the electromagnetic wave blocking layer vertically (it will be the same in the following drawings).

For the wavelength of the laser light L, a wavelength may be arbitrarily selected, which can easily go through the silicon substrate 10, the silicon oxide film 11 and the titanium oxide film 12 and is easily absorbed in the platinum film 13 as the electromagnetic wave absorption layer. For such a wavelength of the laser light L, in the present embodiment, as an example, a wavelength greater than or equal to 1200 nm (for example, a wavelength of 1470 nm) is selected. Moreover, a beam profile of the laser light L may be, for example, a flat top. But, the beam profile of the laser light L may be a Gaussian profile.

The platinum film 13 has an absorption coefficient which is quite large at around a wavelength of 1470 nm, i.e. $6 \times 10^5$ $cm^{-1}$. Moreover, for example, for the platinum film 13 having the film thickness of 100 nm, the transmittance of light with the wavelength around 1470 nm is less than or equal to 1%. Accordingly, light energy of the laser light L with the wavelength around 1470 nm shed on the region corresponding to the opening 200x of the platinum film 13 is almost absorbed in the region corresponding to the opening 200x of the platinum film 13.

The light energy of the laser light L shed on the region corresponding to the opening 200x of the platinum film 13 is converged into heat, and the region corresponding to the opening 200x of the platinum film 13 is heated. The heat in the region corresponding to the opening 200x of the platinum film 13 is transferred (diffused) to the SAM film 210 formed on the region corresponding to the opening 200x of the platinum film 13, and the region of the SAM film 210 corresponding to the opening 200x is locally heated from the side of the platinum film 13.

That is, in the SAM film 210 a heat distribution is formed, the region of the SAM film 210 corresponding to the opening 200x becomes a high temperature region, and the other region becomes a low temperature region. By controlling a power of shedding the laser light L so that a temperature of the high temperature region is higher than or equal to the temperature at which the SAM film is thermally decomposed, the SAM film 210 formed in the high temperature region is thermally decomposed and eliminated.

That is, in the SAM film 210, an opening 210x (second opening) corresponding to the opening 200x is formed, and it performs a patterning for the SAM film 210 in a shape corresponding to the electromagnetic wave blocking layer 200. The region of the platinum film 13 where the SAM film 210 is formed is hydrophobic, and a surface of the platinum film 13 exposed into the opening 210x is hydrophilic.

Meanwhile, since the temperature at which the SAM film 210 is thermally decomposed and eliminated is about 500° C., an emission power of the laser light L is controlled in advance so that a temperature in the region (high temperature region) of the SAM film 210 corresponding to the opening 200x is greater than or equal to 500° C. (for example, 600° C.). At this time, the region (low temperature region) other than the region (high temperature region) of the SAM film 210 corresponding to the opening 200x is little heated, is at a temperature less than the temperature at which the SAM film is thermally decomposed, and the SAM film remains without being eliminated.

In this way, it is possible to shed an electromagnetic wave on the SAM film 210 via the electromagnetic wave blocking layer 200 provided with the opening 200x from the rear surface side of the silicon substrate 10 to form a heat distribution, and to remove a part of the SAM film 210 to perform a patterning for the SAM film 210 in a shape corresponding to the electromagnetic wave blocking layer 200.

Moreover, as shown in FIG. 1C, a beam width of the laser light L is not restricted, and laser light L having a beam width which is greater than the opening 200x may be used. Accordingly, it is possible to collectively shed plural points (plural openings) to form plural patterns collectively on a surface side of the silicon substrate 10. However, laser light L having a beam width which is less than the opening 200x. In this case, while moving the shed position of the laser light L, the entire opening 200x is shed serially.

Moreover, since only the laser light L shed in the opening 200x reaches the layer to be heated, even if there is an intensity distribution around the laser light L, by using a flat part of the profile, a pattern with high precision can be formed.

Meanwhile, after the process shown in FIG. 1C, it is possible to form a layer to be heated in the opening 210x of the SAM film 210, to shed an electromagnetic wave on the layer to be heated from the rear surface side of the silicon substrate, and to perform, for example, a process of changing a crystalline characteristic. At this time, since the electromagnetic wave is shed via the opening 200x of the electromagnetic wave blocking layer 200, the SAM film 210 is not heated. Therefore, also after performing the process of changing the crystalline characteristic, the SAM film 210 remains without being eliminated. Accordingly, even in the case of repeatedly performing the process of changing the crystalline characteristic of the layer to be heated, it is not necessary to reform the SAM film 210, and a desired pattern (pattern on the layer to be heated) can be formed with a simple manufacturing process. This feature will be explained in detail in the following embodiments.

Second Embodiment

In a second embodiment, an example of forming an amorphous PZT film, which is a layer to be heated, in the opening of the SAM film, shedding an electromagnetic wave on the amorphous PZT film to heat the amorphous PZT film and changing the crystalline characteristic of the amorphous PZT film will be explained. Meanwhile, in the second embodiment, an explanation for the same member as that in the embodiment which has already been explained will be omitted.

Meanwhile, the PZT is a solid solution of a lead zirconate ($PbZrO_3$) and a lead titanate ($PbTiO_3$), and has various characteristic depending on the ratio of $PbZrO_3$ and $PbTiO_3$. For example, a PZT which has the ratio of $PbZrO_3$ and $PbTiO_3$ of 53:47, expressed by $Pb(Zr_{0.53}, Ti_{0.47})O_3$ in a chemical formula, or by PZT(53/47) in general, or the like may be used.

FIGS. 2A, 2B, 3A and 3B are cross-sectional diagrams for explaining a pattern formation method according to the second embodiment. At first, by the same method as in the first embodiment, on the top surface side of the silicon substrate 10, a silicon oxide film 11, a titanium oxide film 12 and a platinum film 13 are laminated in series, and on the rear surface side of the silicon substrate 10 an electromagnetic wave blocking layer 200 provided with an opening part 200x is formed. And, on the platinum film 13, a SAM film 210 provided with an opening 210x corresponding to the opening 200x of the electromagnetic wave blocking layer 200 is formed.

Figure 2A:
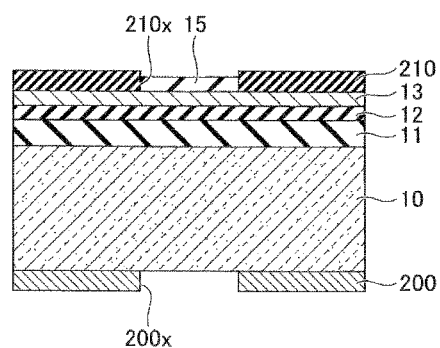
FIGS. 2A and 2B are first cross-sectional diagrams for explaining an example of a pattern formation method according to a second embodiment.
Figure 2B:
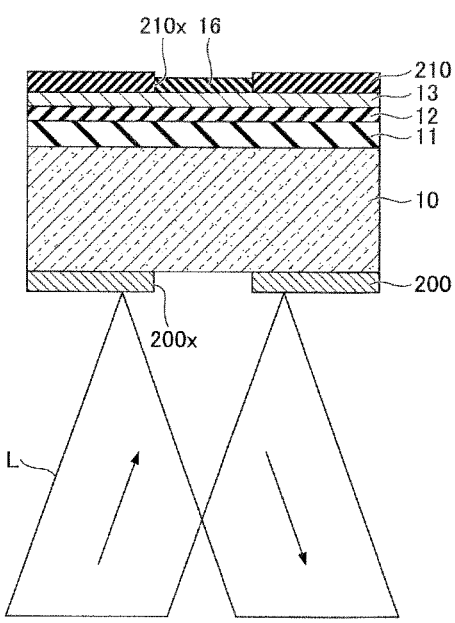

Next, in processes shown in FIGS. 2A and 2B, on the platinum film 13 exposed in the opening 210x a crystalline PZT 16 which is a piezoelectric film is formed. At first, in a process shown FIG. 2A, for example, by an inkjet printing, on the platinum film 13 exposed in the opening 210x, a PZT precursor solution (PZT sol-gel liquid), which becomes the crystalline PZT 16 finally, is discharged.

A synthesis of the PZT precursor solution is performed, for example, by the following process. At first, for a start material, a lead acetate trihydrate, a titanium isopropoxide, and a zirconium isopropoxide are used. A crystalline material of the lead acetate trihydrate is dissolved in methoxy ethanol, and dehydrated. And, the titanium isopropoxide and the zirconium isopropoxide are dissolved in the methoxy ethanol, an alcohol exchange reaction and an esterification reaction proceed, and by mixing with the methoxy ethanol solution in which the lead acetate trihydrate is dissolved, thereby the PZT precursor solution is synthesized. A concentration of the PZT precursor solution may be, for example, 0.3 mol/liter.

As described above, since a region on the platinum film 13 where the SAM film 210 is formed is hydrophobic, and the surface of the platinum film 13 exposed in the opening 210x is hydrophilic, using a contrast of the surface energy as above, it is possible to apply the PZT precursor solution selectively. That is, according to the contrast of the surface energy, only the hydrophilic region (on the platinum film 13 exposed in the opening 210x) where the SAM film 210 does not exist becomes wet with the PZT precursor solution.

In this way, by forming the PZT precursor solution only in the region where the SAM film 210 does not exist using the contrast of the surface energy, a used amount of the solution to be applied can be reduced compared with a process by the spin coat method or the like, and the process can be simplified.

Next, the silicon substrate 10, in which the PZT precursor solution is formed on the platinum film 13 exposed in the opening 210x, is placed, for example, on a hot plate (not shown), and is heated at a temperature less than 500° C. (for example, approximately 100 to 300° C.). In this way, the solvent evaporates, the PZT precursor solution is thermally decomposed to become an amorphous PZT film 15 in a solid state (amorphous complex oxide film). Meanwhile, in the present embodiment, the amorphous PZT film 15, which is a layer to be heated, directly contacts the platinum film 13 which is an electromagnetic wave absorption layer.

Next, in the process shown in FIG. 2B, an electromagnetic wave is shed via the electromagnetic wave blocking layer 200 from the rear surface side of the silicon substrate 10. In the present embodiment, for the electromagnetic wave, laser light L of continuous oscillation is selected, and via the electromagnetic wave blocking layer 200, the laser light L of continuous oscillation is shed. In the same way as the process shown in FIG. 1C, only the laser light L shed in the opening 200x goes through the silicon substrate 10, the silicon oxide film 11 and the titanium oxide layer 12, and reaches the platinum film 13. That is, the laser light L is locally shed in the region corresponding to the opening 200x of the platinum film 13.

For the wavelength of the laser light L, a wavelength that easily passes through the silicon substrate 10, the silicon oxide film 11 and the titanium oxide film 12 and is easily absorbed by the platinum film 13, which is an electromagnetic wave absorption layer, is arbitrary selected. For the wavelength of the laser light L, as described above, in the present embodiment, in the same way as in the first embodiment, for example, a wavelength greater than or equal to 1200 nm (for example, 1470 nm) is selected.

The light energy of the laser light L absorbed in the region corresponding to the opening 200x of the platinum film 13 is converted into heat, and the amorphous PZT film 15 formed on the platinum 13 exposed in the opening 210x of the SAM film 210 is heated. The amorphous PZT film 15 is changed in quality of film by heat (the crystalline characteristic is changed), to become a crystalline PZT 16. A film thickness of the crystalline PZT 16 may be, for example, about 60 nm.

Meanwhile, since the temperature at which the amorphous PZT film 15 becomes the crystalline PZT 16 is approximately 600 to 800° C., an output power of the laser light L is controlled in advance so that the temperature of the amorphous PZT layer 15 in the opening 210x is approximately 600 to 800° C.

Since the SAM film 210 formed around the amorphous PZT film 15 (crystalline PZT 16) corresponds to the region of the electromagnetic wave blocking layer 200 where the opening 200x is not formed, the SAM film 210 is not heated by the laser light L. Accordingly, the SAM film 210 remains without being eliminated even after the process shown in FIG. 2B. That is, even if an electromagnetic wave is shed on the amorphous PZT layer 15 and the amorphous PZT film is heated at a temperature greater than the temperature at which the SAM film is thermally decomposed, according to an effect by the electromagnetic wave blocking layer 200, the SAM film is not heated at the temperature of thermal decomposition, and remains without being eliminated.

Figure 3A:
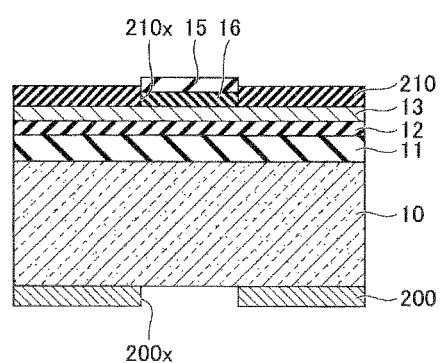
FIGS. 3A and 3B are second cross-sectional diagrams for explaining an example of the pattern formation method according to the second embodiment.
Figure 3B:
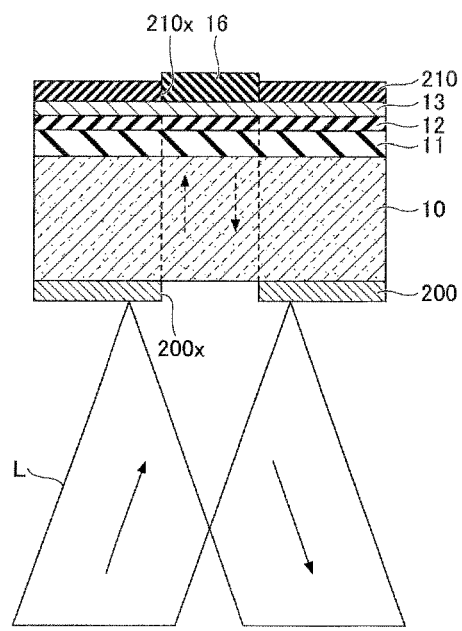

Next, in processes shown in FIGS. 3A and 3B, by repeating the process shown in FIGS. 2A and 2B, the thickness of the crystalline PZT 16 is increased. That is, the film thickness of the crystalline PZT 16 used as a piezoelectric film is preferably about a few rm. For example, by repeating the process shown in FIGS. 2A and 2B 30 times, a film of the crystalline PZT 16, a thickness of which is increased up to 2 μm, can be manufactured.

Specifically, in the process shown in FIG. 3A, for example, by inkjet printing, on the crystalline PZT 16 (on the layer to be heated, which has been heated) exposed in the opening 210x, the PZT precursor solution is discharged. In the process shown in FIG. 3A, since the SAM film remains, according to the contrast of the surface energy, the PZT precursor solution is applied only in the hydrophilic region where the SAM film 210 does not exist (on the crystalline PZT 16 exposed in the opening 210x).

Next, the silicon substrate 10, in which the PZT precursor solution is formed on the crystalline PZT 16 exposed in the opening 210x, is placed, for example, on a hot plate (not shown), and is heated at a temperature less than 500° C. (for example, approximately 100 to 300° C.). In this way, the solvent evaporates, the PZT precursor solution is thermally decomposed to become an amorphous PZT film 15 in a solid state (second layer to be heated).

Next, in the process shown in FIG. 3B, in the same way as the process shown in FIG. 2B, by shedding the laser light L via the electromagnetic wave blocking layer 200 from the rear surface side of the silicon substrate 100, the amorphous PZT film 15 is changed in quality of film (the crystalline characteristic is changed), to become the crystalline PZT 16. A film thickness of the crystalline PZT 16 may be, for example, about 60 nm. A total thickness of the crystalline PZT 16 may be, for example, about 120 nm. Even after the process shown in FIG. 3B, the SAM film 210 remains without being eliminated.

Furthermore, by repeating the process shown in FIGS. 3A and 3B a necessary number of times, the crystalline PZT 16 having a desired film thickness can be obtained. Meanwhile, even after any of the processes, the SAM film 210 remains without being eliminated.

Meanwhile, in the processes, described as above, for a material of the layer to be heated, a material other than the PZT, for example, $BaTiO_3$, $SnO_2$, $SiO_2$ or the like may be used.

In this way, in the present embodiment, since in the process of heating the amorphous PZT film 15 to form the crystalline PZT 16 the SAM film 210 is not heated, the SAM film 210 remains without being eliminated. Accordingly, even if the process of heating the amorphous PZT film to form the crystalline PZT 16 is repeatedly performed in order to increase the film thickness of the crystalline PZT 16, the SAM film 210 is not eliminated. Therefore, the process of forming the SAM film 210 may be performed only once in the early stage. Accordingly, the man-hours for manufacturing can be substantially reduced.

Moreover, the amorphous PZT film 15, which is a layer to be heated, is locally heated to become the crystalline PZT 16. Accordingly, even in the case of applying to a device having a structure, an element or the like other than the layer to be heated, another member (other structure, element or the like), which does not require a heating treatment, is not heated, a deviation in an accuracy of dimension or the like according to a thermal damage or a thermal stress may not occur, and a performance degradation of the device can be avoided. Accordingly, it is preferable if the pattern formation method according to the present embodiment is applied to a sensor, an actuator or the like which is a device having a structure, an element or the like other than a layer to be heated. In particular, it is preferable if it is applied to a micro device for performing a precise control.

Meanwhile, in the present embodiment, the layer to be heated is heated from the rear surface side of the silicon substrate 10. According to this feature, the present embodiment has the following effect.

Assume that the layer to be heated is heated from the top surface side of the silicon substrate 10. In this case, when the layers to be heated are laminated and the film thickness (total thickness) increases, a light absorptivity of the layers to be heated changes. In the case where the light absorptivity changes, even when laser light having the same power is shed, the temperature for heating is different. Accordingly, in order to heat the layers to be heated always at a constant temperature irrespective of the film thickness, the power of the laser light to be shed on the layers to be heated needs to be set in each case corresponding to the film thickness of the layers to be heated.

The power of the laser light can be set, for example, based on a relation between the film thickness and the light absorptivity which is measured in advance. However, when the power of the laser light to be shed on the layers to be heated is set corresponding to the number of times of the lamination of the layer to be heated, the manufacturing process becomes quite complicated. Moreover, as a result of the above, the production cost for the piezoelectric element or the liquid discharge head rises. It is not preferable.

On the other hand, in the present embodiment, the electromagnetic wave is shed on the electromagnetic wave absorption layer (platinum film 13) from the rear surface side of the silicon substrate 10, and a heat distribution is formed in the electromagnetic wave absorption layer, the heat distribution in the electromagnetic wave absorption layer is transferred to the layer to be heated, and the layer to be heated is heated.

In this case, the laser light is mostly absorbed by the electromagnetic wave absorption layer, and almost no laser light goes through the electromagnetic wave absorption layer and reaches the layer to be heated. Accordingly, even when the plural layers to be heated are laminated and the film thickness changes, it is not necessary to take account of the influence of the change in the light absorptivity.

That is, as in the present embodiment, when the laser light is shed on the electromagnetic wave absorption layer from the rear surface side of the silicon substrate 10, irrespective of the film thickness of the layers to be heated formed on the top surface side of the electromagnetic absorption layer, the laser light with a constant power is shed and the layer to be heated is heated. That is, in the method according to the present embodiment, without taking account of the film thickness of the layers to be heated formed on the top surface side of the electromagnetic wave absorption layer, the power of the laser light to be shed can be controlled easily. As a result, for example, in the case of crystallizing the layers to be heated, a crystalline film with a uniform crystalline characteristic can be formed.

Third Embodiment

In a third embodiment, an other method of forming a patterned crystalline PZT using a SAM film as a mask (pattern formation method) will be explained. Meanwhile, in the third embodiment, an explanation for the same member(s) as that in the embodiments which have already been explained will be omitted.

FIGS. 4A, 4B, 5A and 5B are cross-sectional diagrams for explaining a pattern formation method according to the third embodiment. At first, by the same method as in the first embodiment, on the top surface side of the silicon substrate 10, a silicon oxide film 11, a titanium oxide film 12 and a platinum film 13 are laminated in series, and on the rear surface side of the silicon substrate 10 an electromagnetic wave blocking layer 200 provided with an opening part 200x is formed.

Figure 4A:
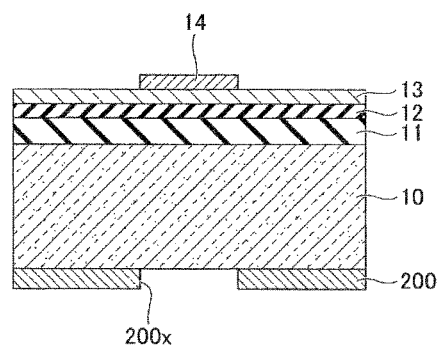
FIGS. 4A and 4B are first cross-sectional diagrams for explaining an example of a pattern formation method according to a third embodiment.

Next, in a process shown in FIG. 4A, on the platinum film 13, a conductive oxide film 14 patterned so as to correspond to the opening 200x is formed. In the present embodiment, an example of forming a $SrRuO_3$ film as the conductive oxide film 14 will be shown. Specifically, on a whole surface of the platinum film 13, for example, by the sputtering method or the like, a $SrRuO_3$ film is formed as the conductive oxide film 14. Then, by the photolithography method, the etching method or the like, the conductive oxide film 14 is partially removed, and the conductive oxide film 14 patterned so as to correspond to the opening 200x is formed. A thickness of the conductive oxide film 14 may be, for example, about 60 nm.

Meanwhile, the conductive oxide film 14 may form a lower electrode of the piezoelectric element with the platinum film 13. In the case of using a complex oxide film including lead such as PZT as the piezoelectric film, the lead may react with the platinum film 13 or the lead may diffuse in the platinum film 13, and the piezoelectric characteristic may be degraded. By providing the conductive oxide film 14 between the complex oxide film including lead and the platinum film 13, the conductive oxide film 14 becomes a barrier against the reaction of the lead and the platinum film 13 and against the diffusion, and the degradation of the piezoelectric characteristic can be prevented.

Figure 4B:
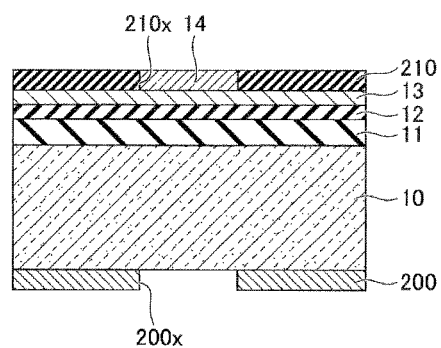

Next, in a process shown in FIG. 4B, on the platinum film 13 where the conductive oxide film 14 is not formed, the SAM film 210 is formed. The SAM film 210 has a high affinity for the platinum film 13, but has a low affinity for the conductive oxide film 14. Accordingly, for example, by the dip method, only on the platinum film 13 where the conductive oxide film 14 is not formed, the SAM film 210 is easily formed. Meanwhile, a part where the SAM film 210 is not formed (a part where the conductive oxide film 14 is formed) corresponds to the opening 210x in the first embodiment or the like.

In this way, it does not necessarily have to use the method of locally heating the SAM film 210 and thermally dissolving and eliminating the heated part of the SAM film 210 for forming an opening 210x in the SAM film 210.

Figure 5A:
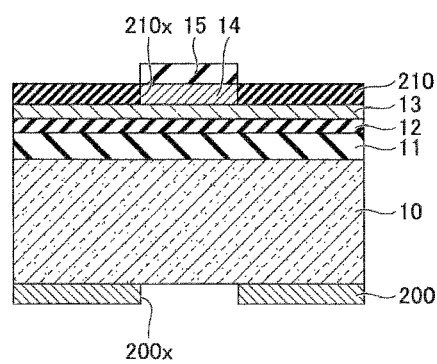
FIGS. 5A and 5B are second cross-sectional diagrams for explaining an example of the pattern formation method according to the third embodiment.

Next, in a process shown in FIG. 5A, for example, by the dip method, on the conductive oxide film 14, the PZT precursor solution which finally becomes a crystalline PZT 16 is applied. The region on the platinum film 13 where the SAM film 210 is formed is hydrophobic, but a surface of the conductive oxide film 14 is hydrophilic. Accordingly, only on the conductive oxide film 14 the PZT precursor solution can be applied easily.

Then, the silicon substrate 10, in which the PZT precursor solution is formed on the conductive oxide film 14 exposed in the opening 210x, is placed, for example, on a hot plate (not shown), and is heated at a temperature less than 500° C. (for example, approximately 100 to 300° C.). In this way, the solvent evaporates, the PZT precursor solution is thermally decomposed to become an amorphous PZT film 15 in a solid state.

Figure 5B:
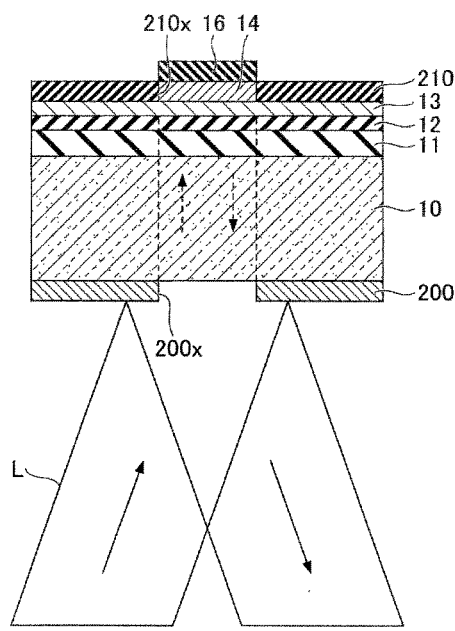

Next, in the process shown in FIG. 5B, in the same way as the process shown in FIG. 2B, an electromagnetic wave is shed via the electromagnetic wave blocking layer 200 from the rear surface side of the silicon substrate 10. In the present embodiment, for the electromagnetic wave, laser light L of continuous oscillation is selected, and via the electromagnetic wave blocking layer 200, the laser light L of continuous oscillation is shed. In the same way as the process shown in FIG. 1C, only the laser light L shed in the opening 200x goes through the silicon substrate 10, the silicon oxide film 11 and the titanium oxide layer 12, and reaches the platinum film 13. That is, the laser light L is locally shed in the region corresponding to the opening 200x of the platinum film 13.

For the wavelength of the laser light L, a wavelength that easily passes through the silicon substrate 10, the silicon oxide film 11 and the titanium oxide film 12 and is easily absorbed by the platinum film 13, which is an electromagnetic wave absorption layer, is arbitrary selected. For the wavelength of the laser light L, as described above, in the present embodiment, for example, a wavelength greater than or equal to 1200 nm (for example, 1550 nm) is selected.

The light energy of the laser light L absorbed in the region corresponding to the opening 200x of the platinum film 13 is converted into heat, and the amorphous PZT film 15 is heated via the conductive oxide film 14 formed on the platinum 13 exposed in the opening 210x of the SAM film 210. The amorphous PZT film 15 is changed in quality of film by heat (the crystalline characteristic is changed), to become a crystalline PZT 16. A film thickness of the crystalline PZT 16 may be, for example, about 60 nm.

Meanwhile, since the temperature at which the amorphous PZT film 15 becomes the crystalline PZT 16 is approximately 600 to 800° C., an output power of the laser light L is controlled in advance so that the temperature of the amorphous PZT layer 15 in the opening 210x is approximately 600 to 800° C.

Since the SAM film 210 formed around the amorphous PZT film 15 (crystalline PZT 16) corresponds to the region of the electromagnetic wave blocking layer 200 where the opening 200x is not formed, the SAM film is not heated by the laser light L. Accordingly, the SAM film 210 remains without being eliminated even after the process shown in FIG. 5B.

Furthermore, by repeating the process shown in FIGS. 3A and 3B explained in the second embodiment necessary times, the crystalline PZT 16 having a desired film thickness can be obtained. Meanwhile, even after any of the processes, the SAM film 210 remains without being eliminated.

In this way, the crystalline PZT 16 formed to have a pattern corresponding to the opening 210x of the SAM film 210 may directly contact the platinum film 13 which is the electromagnetic wave absorption layer, as in the second embodiment, or may not contact the platinum film 13 which is the electromagnetic wave absorption layer. Even in the case where the crystalline PZT 16 does not directly contact the platinum film 13 which is the electromagnetic wave absorption layer and is heated indirectly via other film, as in the present embodiment, it has the same effect as the second embodiment.

Meanwhile, in the present embodiment, the $SrRuO_3$ film is illustrated as the conductive oxide film 14. But, it is not limited to this. As the conductive oxide film 14, for example, $LaNiO_3$, PT ($PbTiO_3$) or the like may be used.

Fourth Embodiment

In a fourth embodiment, an example of forming a concave-convex structure so as to lower the reflectance in a predetermined region of the silicon substrate 10 relatively without forming the electromagnetic wave blocking layer 200 will be explained. Specifically, an example of selectively removing on the rear surface side of the silicon substrate 10 to form a concave-convex structure (concave portion 10x) will be explained. Meanwhile, in the fourth embodiment, an explanation for the same member(s) as that in the embodiments which have already been explained will be omitted.

For example, in the case where the wavelength of the laser light L is 1470 nm, taking into account that a refraction index (nSi) of the silicon substrate 10 for the laser light L is about 3.5, an optical path difference according to a total thickness variation (TTV) of 1 µm is greater than or equal to twice the wavelength of the laser light L. When the optical path difference as described above occurs, by an interference effect, a reflectance of the silicon substrate 10 fluctuates. In other words, by providing a change in thickness on the silicon substrate 10, the reflectance in the predetermined region of the silicon substrate 10 can be lowered relatively. A specific example is shown in the following.

Figure 6:
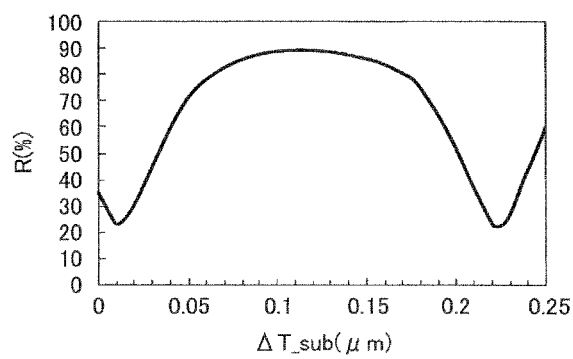
FIG. 6 is a diagram illustrating an example of a change in a reflectance for a period with respect to a change in a thickness of a silicon substrate according to the present embodiment.

FIG. 6 is a diagram illustrating a change in the reflectance of the silicon substrate with respect to the change in thickness of the silicon substrate for one cycle of the change in the reflectance. Meanwhile, in FIG. 6, as an example, data are shown in the case where the thickness of the silicon substrate is about 500 µm, the film thickness of the silicon oxide film 11 is about 600 nm, the film thickness of the titanium oxide film 12 is about 50 nm, and the film thickness of the platinum film is about 100 nm. Also in the case of the other condition, data equivalent to FIG. 6 can be obtained experimentally or by simulation.

As shown in FIG. 6, when the thickness change ΔT_sub of the silicon substrate 10 is 0 µm, the reflectance R is about 30%. For the thickness change ΔT_sub of 0.12 µm, the reflectance R is about 90%. That is, by providing a concave-convex structure of about 120 nm on the silicon substrate 10, the reflectance in the predetermined region of the silicon substrate 10 can be relatively lowered.

Then, in the present embodiment, a process of providing a concave portion on the rear surface side of the silicon substrate 10 will be explained. FIGS. 7A, 7B, 8A and 8B are cross-sectional diagrams for explaining the pattern formation method according to the fourth embodiment. At first, in a process shown in FIG. 7A, a concave portion 10x is formed on the rear surface side of the silicon substrate 10. At this time, as shown in FIG. 6, when the thickness T of the silicon substrate 10 is 500 m and the thickness change ΔT_sub is 0.12 µm, the reflectance of the concave portion 10x of the silicon substrate 10 is about 30%, and the reflectance of another region is about 90%. That is, the reflectance of the region of the silicon substrate where the concave portion 10x is formed can be relatively lowered.

The concave portion 10x can be formed by, for example, a method combining the photolithography method, the wet etching method or the like. However, in the case where it is difficult to form the concave portion 10x of about 0.12 µm, focusing attention on the characteristic of cyclically changing as shown in FIG. 6, the value of the thickness change ΔT_sub may be determined arbitrarily so that a difference between the reflectances of the concave portion 10x and of the other portion is a desired value. In this case, the difference in reflectance is preferably as great as possible, and it is more preferable if the reflectance of the concave portion is set to be about 30% and the reflectance of the other portion is set to be more than 60%.

After forming the concave portion 10x on the rear surface side of the silicon substrate 10, by the same method as in the first embodiment, on the top surface side of the silicon substrate 10, the silicon oxide film 11, the titanium oxide film 12, a platinum film 13 and the SAM film 210 are laminated in series.

Figure 7A:
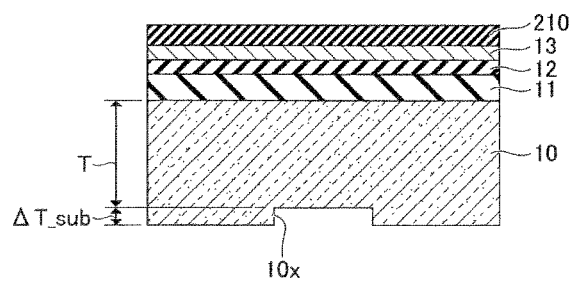
FIGS. 7A and 7B are first cross-sectional diagrams for explaining an example of a pattern formation method according to a fourth embodiment.
Figure 7B:
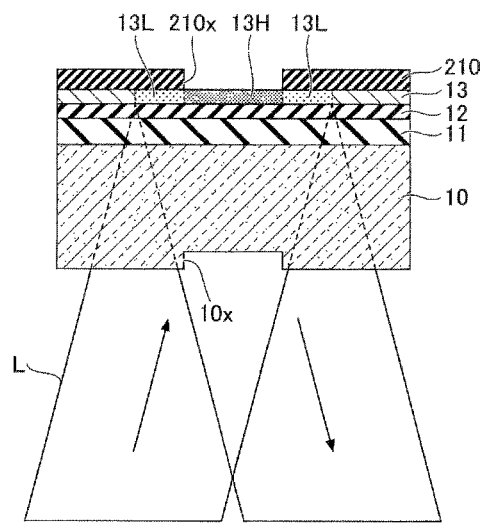

Next, in a process shown in FIG. 7B, an electromagnetic wave is shed on the SAM film 210 via the convex-concave structure from the rear surface side of the silicon substrate 10, to form a heat distribution, a part of the SAM film is removed, and the SAM film 210 is patterned to have a shape corresponding to the predetermined region where the reflectance is relatively low. Meanwhile, in the present embodiment, for the electromagnetic wave, laser light L of continuous oscillation is selected, and via the convex-concave structure (concave portion 10x), the laser light L of continuous oscillation is shed.

In the silicon substrate 10, since the reflectance of the concave portion 10x is relatively lower than the reflectance of a portion other than the concave portion 10x, an intensity of laser light L that reaches a region 13H in the platinum film 13 which is the electromagnetic wave absorption layer corresponding to the concave portion 10x is greater than an intensity of the laser light L that reaches a region 13L around the region 13H. As a result, a temperature of the region 13H is greater than a temperature of the region 13L. Accordingly, the SAM film 210 on the region 13H is locally heated from the side of the platinum film 13.

That is, a heat distribution is formed in the SAM film 210, the SAM film 210 on the region 13H is a high temperature region, and that on the other region is a low temperature region. Accordingly, the SAM film 210 on the region 13H, which is the high temperature region is thermally decomposed and is eliminated, thereby an opening 210x corresponding to the concave portion 10x is formed in the SAM film 210. That is, the SAM film 210 is patterned in a shape corresponding to the concave portion 10x. The region on the platinum film where the SAM film 210 is formed is hydrophobic and the surface of the platinum film 13 exposed in the opening 210x is hydrophilic.

Meanwhile, since the temperature at which the SAM film 210 is thermally decomposed and eliminated is about 500° C., an emission power of the laser light L is controlled in advance so that a temperature in the region 13H is greater than or equal to 500° C. (for example, about 600° C.), and the region 13L is less than 500° C. (for example, about 300° C.). Accordingly, only the SAM film 210 on the region 13H can be removed.

Figure 8A:
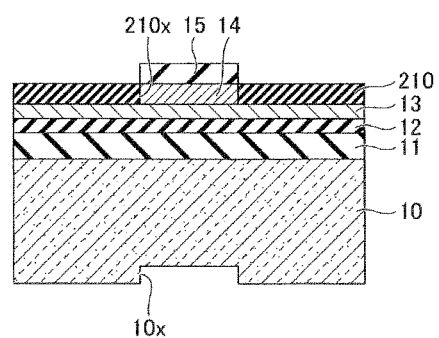
FIGS. 8A and 8B are second cross-sectional diagrams for explaining an example of the pattern formation method according to the fourth embodiment.

Next, in a process shown in FIG. 8A, for example, by the inkjet printing, on the platinum film 13 exposed in the opening 210x, a solution which finally becomes a conductive oxide film 14 is discharged. In the present embodiment, an example of forming PT (PbTiO₃) as the conductive oxide film 14 will be explained.

According to the contrast of the surface energy, only the hydrophilic region (on the platinum film 13 exposed in the opening 210x) where the SAM film 210 does not exist becomes wet with the PT (PbTiO₃) solution. After that, the PT (PbTiO₃) solution is dried, and furthermore, in the same way as in FIG. 7B, the laser light L is shed, thereby the conductive oxide film 14 including the PT (PbTiO₃) is formed.

Next, in the same way as the process shown in FIG. 2A, for example, by an inkjet printing, on the conductive oxide film 14 exposed in the opening 210x, a PZT precursor solution, which becomes the crystalline PZT 16 finally, is discharged. According to the contrast of the surface energy, only the hydrophilic region (on the conductive oxide film 14 exposed in the opening 210x) where the SAM film 210 does not exist becomes wet with the PZT precursor solution.

Next, the silicon substrate 10, in which the PZT precursor solution is formed on the conductive oxide film 14 exposed in the opening 210x, is placed, for example, on a hot plate (not shown), and is heated at a temperature less than 500° C. (for example, approximately 100 to 300° C.). In this way, the solvent evaporates, the PZT precursor solution is thermally decomposed to become an amorphous PZT film 15 in a solid state (amorphous complex oxide film).

Figure 8B:
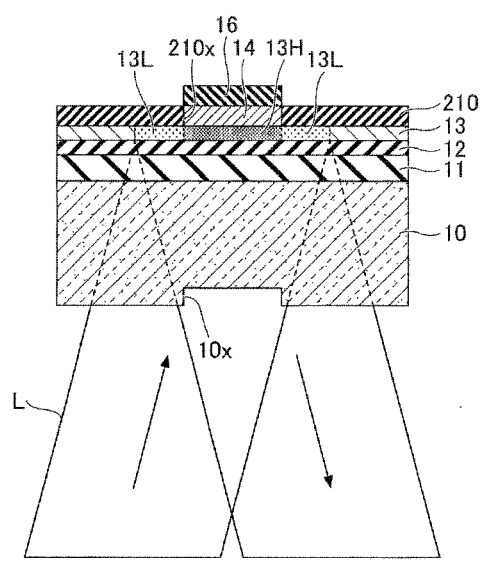

Next, in a process shown in FIG. 8B, the laser light L of continuous oscillation is shed from the rear surface side of the silicon substrate 10. In the same way as the process shown in FIG. 7B, heat distributions are formed in the region 13H and the region 13L of the platinum film 13, and the amorphous PZT film 15 is heated via the conductive oxide film 14 on the region 13H of the platinum film 13. The amorphous PZT film 15 is changed in quality of film by heat (the crystalline characteristic is changed), to become a crystalline PZT 16. A film thickness of the crystalline PZT 16 may be, for example, about 60 nm.

Meanwhile, since the temperature at which the amorphous PZT film 15 becomes the crystalline PZT 16 is approximately 600 to 800° C., an output power of the laser light L is controlled in advance so that the temperature of the amorphous PZT layer 15 in the opening 210x is approximately 600 to 800° C.

Since the SAM film 210 formed around the amorphous PZT film 15 (crystalline PZT 16) corresponds to the region where the concave portion 10x is not formed, the SAM film 210 is not heated up to the predetermined temperature of thermal decomposition. Accordingly, the SAM film 210 remains without being eliminated even after the process shown in FIG. 8B.

Furthermore, by repeating the process shown in FIGS. 8A and 8B a necessary amount of times, the crystalline PZT 16 having a desired film thickness can be obtained. Meanwhile, even after any of the processes, the SAM film 210 remains without being eliminated.

In this way, in the present embodiment, since an object to be patterned is heated locally, instead of forming the electromagnetic wave blocking layer 200 on the rear surface side of the silicon substrate 10, the concave portion 10x may be formed and a reflectance of a predetermined region of the silicon substrate 10 may be lowered relatively. In this case, in addition to the effect in the second embodiment, there is an effect as follows. That is, without forming the electromagnetic wave blocking layer 200 using an expensive material such as chromium (Cr), only by forming the concave portion 10x, the reflectance of the silicon substrate 10 itself is partially changed, and it contributes to a reduction of a manufacturing cost.

Meanwhile, in the present embodiment, the PT (PbTiO$_3$) film is illustrated as the conductive oxide film 14. But, it is not limited to this. As the conductive oxide film 14, for example, LaNiO$_3$, SrRuO$_3$ or the like may be used.

Fifth Embodiment

In a fifth embodiment, an other example of forming a concave-convex structure so as to lower the reflectance in a predetermined region of the silicon substrate 10 relatively without forming the electromagnetic wave blocking layer 200 will be explained. Specifically, an example of selectively forming an optical film, a refraction index of which is different from that of the silicon substrate 10 for a wavelength of an electromagnetic wave, on the rear surface side of the silicon substrate 10 to form a concave-convex structure will be explained. Meanwhile, in the fifth embodiment, an explanation for the same member as that in the embodiments which have been already explained will be omitted.

For example, by selectively forming an optical film having a predetermined refraction index on the rear surface side of the silicon substrate 10 to form a concave-convex structure, the reflectance in a predetermined region of the silicon substrate 10 can be lowered relatively. A specific example is shown in the following.

Figure 9:
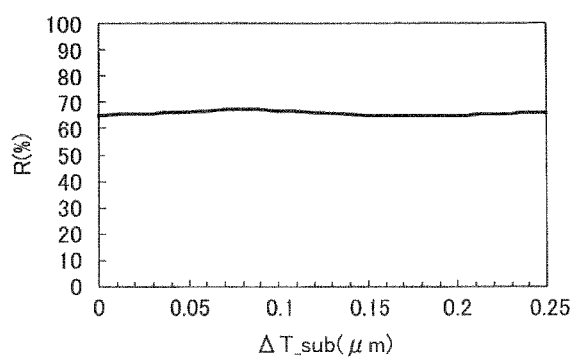
FIG. 9 is a diagram illustrating an example of a change in a reflectance for a period with respect to a change in a thickness of a silicon substrate on a rear side of which an optical film is formed according to the present embodiment.

FIG. 9 is a diagram illustrating a change in the reflectance of the silicon substrate, on the rear surface side of which an optical film is formed, with respect to the change in thickness of the silicon substrate for one cycle of the change in the reflectance. Meanwhile, in FIG. 9, as an example, data are shown in the case where the thickness of the silicon substrate is about 500 μm, the film thickness of the silicon oxide film 11 is about 600 nm, the film thickness of the titanium oxide film 12 is about 50 nm, and the film thickness of the platinum film is about 100 nm.

Moreover, a film thickness df of the optical film (physical thickness) is set so as to approximately satisfy the relation:

$$nf \times df \text{ (optical thickness)} = \lambda/4,$$

where the wavelength of the laser light L is λ, the refraction index of the optical film is nf. Specifically, the wavelength λ of the laser light L is 1470 nm, a zirconia oxide film evaporated by the electron beam evaporation method (refraction index nf is 1.85 for wavelength of 1470 nm) is used for the optical film, and the film thickness df (physical thickness) of the optical film is 200 nm.

Also in the case of the other condition, data equivalent to FIG. 9 can be obtained experimentally or by simulation.

As shown in FIG. 9, by forming the predetermined optical film on the rear surface side of the silicon substrate, even if a thickness change ΔT_sub of the silicon substrate 10 is about 250 nm, a variation in the reflectance R can be suppressed within a range of about ±1% at around 66%.

Moreover, compared with FIG. 6, as described above, for example, in the case where the thickness change ΔT_sub is 0 nm, it is found that there is a difference in the reflectance of about 30% according to presence or absence of the optical film. That is, by selectively forming an optical film having a predetermined refraction index on the rear surface side of the silicon substrate 10 to provide a concave-convex structure, a reflectance in a predetermined region of the silicon substrate 10 can be lowered relatively.

Figure 10A:
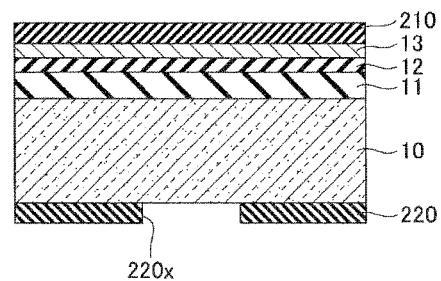
FIGS. 10A and 10B are cross-sectional diagrams for explaining an example of a pattern formation method according to the fourth embodiment.
Figure 10B:
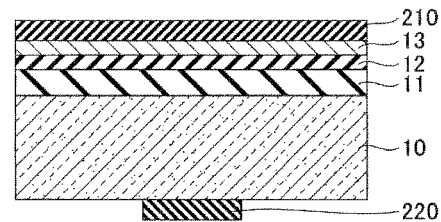

Then, in the present embodiment, a process of selectively providing the optical film on the rear surface side of the silicon substrate 10 will be explained. FIGS. 10A and 10B are cross-sectional diagrams for explaining a pattern formation method according to the fourth embodiment. At first, in a process shown in FIG. 10A, on the rear surface side of the silicon substrate 10, an optical film 220 is selectively formed. The optical film 220 can be formed, for example, by a physical film formation method such as the evaporation method (electron beam evaporation method or the like), the sputtering method or the CVD method. The optical film 220 may be formed by a wet method such as the sol-gel method.

At this time, the thickness of the silicon substrate 10 is set to be about 500 mm. Moreover, as the optical film 220, a zirconia oxide film which approximately satisfies the relation of nf×df (optical thickness)=λ/4 (refraction index nf is 1.85 for wavelength of 1470 nm) is used and the film thickness df (physical thickness) is set to be 200 nm. Accordingly, the reflectance of the opening 200x (region where the optical film 220 is not formed) can be made to be about 30%, and the reflectance other than the opening 220x (region where the optical film 220 is formed) can be made to be about 66% (See FIGS. 6 and 9). That is, the reflectance of the region of the silicon substrate 10 where the optical film 220 is not formed can be lowered relatively.

Meanwhile, the reason for imposing the relation of nf×df (optical thickness)=λ/4 on the optical film 220 is as follows. That is, a variation in the reflectance (R_max/R_min) changes cyclically (cycle is λ/2) for a value of nf×df/λ, and is at a minimum at around nf×df (optical thickness)=λ/4.

Moreover, by setting the refraction index nf of the optical film 220 for λ to a different value from that of the refraction index of the silicon substrate 10 for λ, the reflectance of the silicon substrate 10 can be changed according to presence or absence of the optical film 220. In this case, by setting the value of the refraction index of the optical film 220 for λ greater than the refraction index of air and less than the refraction index of the silicon substrate 10 for λ, the variation in the reflectance (R_max/R_min) of the silicon substrate 10 can be suppressed.

In the following, by the same method as in the fourth embodiment, on the top surface side of the silicon substrate 10, the silicon oxide film 11, the titanium oxide film 12, a platinum film 13 and the SAM film 210 are laminated in series, the opening 210x is formed in the SAM film 210, and furthermore the conductive oxide film 14 or the crystalline PZT 16 may be formed.

Moreover, by selecting the material of the optical film 220, it may be configured as shown in FIG. 10B. That is, although in FIG. 9 the reflectance of the silicon substrate 10 in the case of forming the optical film 220 is about 66%, by selecting the material of the optical film 220, for example, the reflectance can be made to be about 40%.

In this case, by setting the thickness of the silicon substrate to T+ΔT_sub, the reflectance of the region where the optical film 220 is not formed can be made to be 90%. On the other hand, since the reflectance of the region where the optical film 220 is formed is about 40%, in the same way as in FIG. 7A or FIG. 10A, only the predetermined region of the platinum film 13 which is the electromagnetic wave absorption layer can be locally heated.

Meanwhile, in any of the cases of FIGS. 10A and 10B, it is preferable to use an inorganic film which has permeability for the wavelength of the laser light L and high heat resistance for the optical film 220. Heat resistance is required since the heat generated in the platinum film 13 diffuses to the side of the silicon substrate 10.

As an example of the inorganic film, other than the zirconia oxide film ($ZrO_2$ film) as described above, a silicone oxide film ($SiO_2$ film), a silicon nitride film (SiN film) or the like can be used. Moreover, as the optical film 220, for example, an inorganic oxide including any element of Ti, Nb, Ta, Zr, Hf, Ce, Sn, In, Zn, Sb and Al. Or the optical film may include laminated plural films arbitrarily selected from the above inorganic oxide films.

In this way, in the present embodiment, since an object to be patterned is heated locally, by selectively forming the optical film 220 having a predetermined refraction index on the rear surface side of the silicon substrate 10 to form a convex-concave structure, the reflectance of the predetermined region of the silicon substrate 10 may be lowered relatively. In this case, in addition to the effect in the second embodiment, there is an effect as follows. That is, without forming the electromagnetic wave blocking layer 200 using an expensive material such as chromium (Cr), an optical film 220 including a relatively inexpensive inorganic film is formed, and it contributes to a reduction of a manufacturing cost.

Sixth Embodiment

In a sixth embodiment, an example of forming a piezoelectric element by using the pattern formation method according to the first embodiment will be explained. Meanwhile, in the sixth embodiment, an explanation for the same member(s) as that in the embodiments which have been already explained will be omitted.

Figure 11:
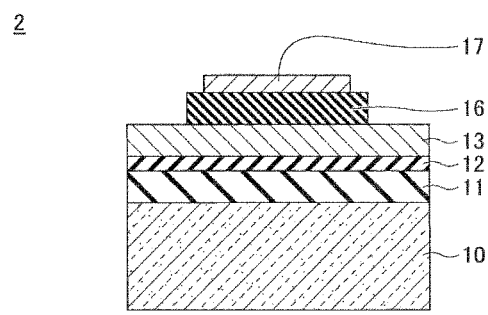
FIG. 11 is a cross-sectional diagram illustrating an example of a piezoelectric element according to a sixth embodiment.

FIG. 11 is a cross-sectional diagram illustrating an example of a piezoelectric element according to the sixth embodiment. Referring to FIG. 11, the piezoelectric element 2 includes a silicon substrate 10, a silicon oxide film 11, a titanium oxide film 12, a platinum film 13, a crystalline PZT 16 and a platinum film 17.

In the piezoelectric element 2, in a predetermined region on the platinum film 13, the crystalline PZT 16 is formed. The film thickness of the crystalline PZT 16 can be made to be about 2 µm, for example. In a predetermined region on the crystalline PZT 16, a platinum film 17 which is a conductive film is formed. The film thickness of the platinum film 17 can be made to be about 100 nm, for example.

In the piezoelectric element 2, the platinum film 13 functions as a lower electrode, the crystalline PZT 16 functions as a piezoelectric film, and the platinum film 17 functions as an upper electrode. That is, when a voltage is applied between the platinum film 13 functioning as the lower electrode and the platinum film 17 functioning as the upper electrode, the crystalline PZT 16 which is the piezoelectric film is mechanically displaced.

The crystalline PZT 16 can be formed by the process using the SAM film shown in FIG. 2A, 2B, 3A, 3B or the like, as described above. By forming the platinum film 17 by, for example, the sputtering method or the like in the predetermined region on the crystalline PZT 16, after forming the crystalline PZT 16, the piezoelectric element 2 is completed.

In a manufacturing method of a piezoelectric film according to the present embodiment, since even if the process of heating the amorphous PZT film 15 to form the crystalline PZT 16 is repeatedly performed in order to increase the film thickness of the crystalline PZT 16, the SAM film 210 is not eliminated, the process of forming the SAM film 210 may be performed only once in the early stage. Accordingly, the man-hours for manufacture can be substantially reduced. Meanwhile, for the piezoelectric film, a material other than the PZT, for example, $BaTiO_3$ or the like may be used.

Seventh Embodiment

In the seventh embodiment, as an application example, an example of a liquid drop discharge head using the piezoelectric element according to the sixth embodiment will be explained. Meanwhile, in the seventh embodiment, an explanation for the same member(s) as that in the embodiments which have been already explained will be omitted.

Figure 12:
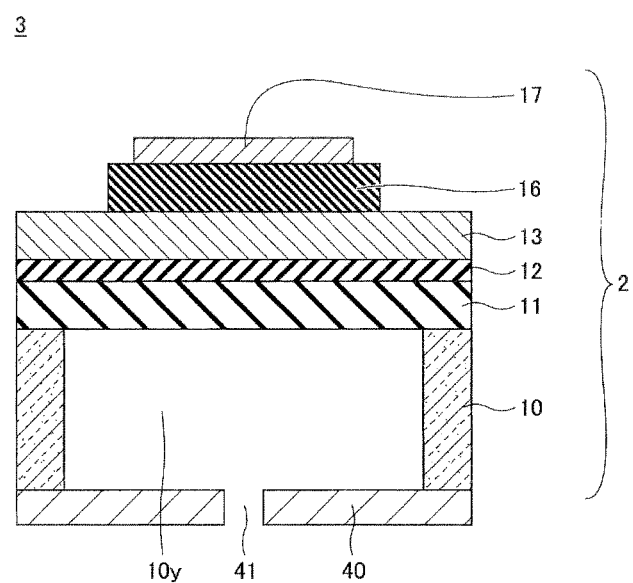
FIG. 12 is a first cross-sectional diagram for explaining an example of a liquid drop discharging head according to a seventh embodiment.

FIG. 12 is a cross-sectional diagram illustrating an example of a liquid drop discharge head according to the seventh embodiment. Referring to FIG. 12, the liquid drop discharge head 3 includes a piezoelectric element 2 and a nozzle plate 40. In the nozzle plate 40, a nozzle 41 for discharging an ink droplet is formed. The nozzle plate 40 can be formed by, for example, nickel electroforming or the like.

By the nozzle plate 40 and a silicon oxide film 11 which is a vibration plate a pressure chamber 10y (it may be called an ink flow path, a pressurized liquid chamber, a compression chamber, a discharge chamber, a liquid chamber or the like) in communication with the nozzle 41 is formed. The silicon oxide film 11 which is a vibration plate form a part of a wall surface of the ink flow path. In other words, the pressure chamber 10y is in communication with the nozzle 41, and is sectioned by the silicon substrate 10 (constituting a lateral face), a nozzle plate 40 (constituting a bottom face) and a silicon oxide film 11 (constituting a top face).

The pressure chamber 10y can be prepared, for example, by processing the silicon substrate 10 by using an etching. For the etching in this case, an anisotropic etching is preferably used. The anisotropic etching utilizes the property that etching rates are different for different plane directions of a crystalline structure. For example, in the anisotropic etching immersed in an alkaline solution such as KOH, an etching rate of (111) plate is about $\frac{1}{400}$ of the etching rate of (100) plate. After that, the nozzle plate 40 having the nozzle 41 is joined to the lower side of the silicon substrate 10. Meanwhile, in FIG. 12, descriptions of a liquid supply unit, a flow path, a fluid resistance and the like are omitted.

The piezoelectric element 2 has a function of pressuring ink in the pressure chamber 10y. The titanium oxide film 12 has a function of improving an adhesion between the platinum film 13 which is the lower electrode and the silicon oxide film 11 which is the vibration plate. Instead of the titanium oxide film 12, for example, a film including Ti, TiN, Ta, $Ta_2O_5$, $Ta_3N_5$, or the like may be used. However, the titanium oxide film 12 is not an indispensable element of the piezoelectric element 2.

In the piezoelectric element 2, when a voltage is applied between the platinum film 13 functioning as the lower electrode and the platinum film 17 functioning as the upper electrode, the crystalline PZT 16 which is the piezoelectric film is mechanically displaced. With the mechanical displacement of the crystalline PZT 16, the silicon oxide film 11 which is a vibration plate is deformedly displaced, for example, in the lateral direction (d31 direction), and pressurizes ink in the pressure chamber 10y. Accordingly, an ink droplet can be discharged from the nozzle 41.

Figure 13:
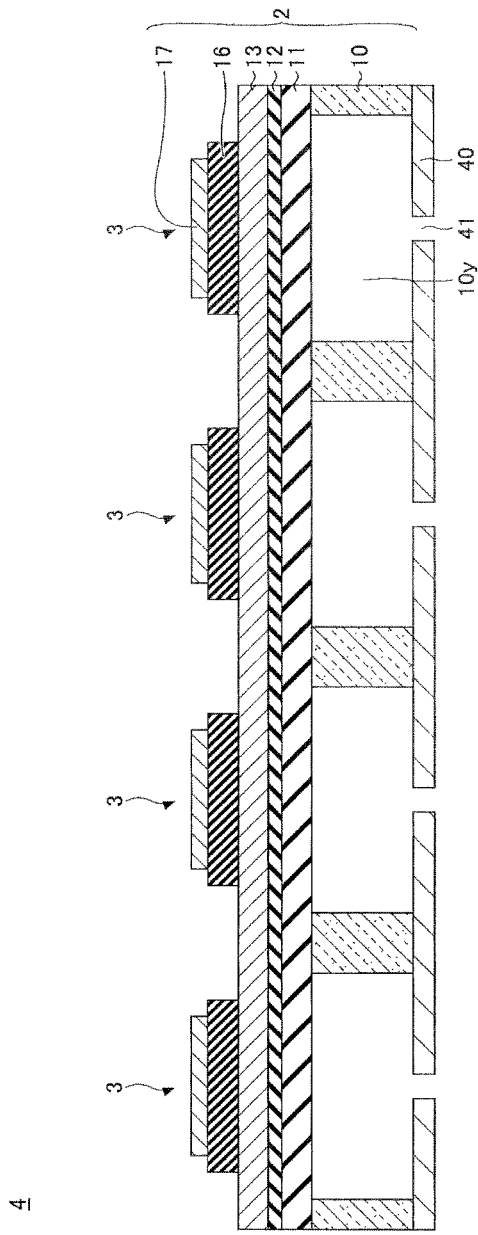
FIG. 13 is a second cross-sectional diagram for explaining an example of the liquid drop discharging head according to the seventh embodiment.

Meanwhile, as shown in FIG. 13, plural liquid drop discharge heads may be provided in parallel to configure a liquid drop discharge head 4.

For the material of the piezoelectric film, an $ABO_3$-type perovskite-type crystalline film other than the PZT may be used. For the $ABO_3$-type perovskite-type crystalline film, for example, a non-lead complex oxide film such as barium titanate may be used. In this case, by using barium alkoxide, titanium alkoxide compound as a starting material, and dissolving in common solvent, a barium titanate precursor solution can be prepared.

To these materials, a complex oxide described in a general expression $ABO_3$, containing as main ingredients A and B where A is Pb, Ba or Sr and B is Ti, Zr, Sn, Ni, Zn, Mg or Nb, correspond. As its specific description, it is expressed by (Pb1-x, Ba)(Zr, Ti)$O_3$, (Pb1-x, Sr)(Zr, Ti)$O_3$, in the case where Pb at an A-site is partially replaced by Ba or Sr. Such replacement is possible if it is a bivalent element, and its effect indicates an effect to reduce a characteristic degradation by an evaporation of lead during a heat treatment.

Eighth Embodiment

Figure 14:
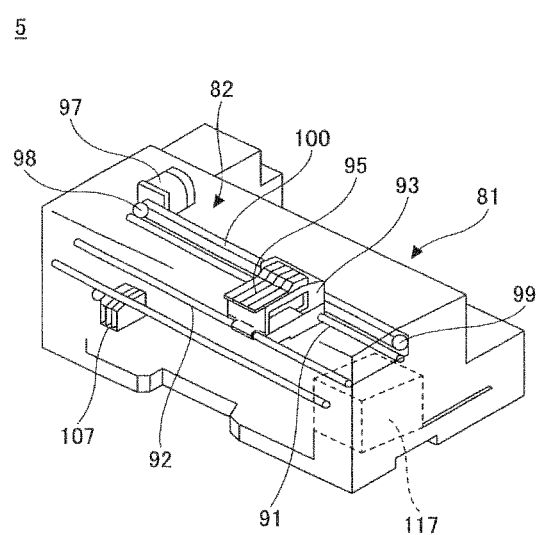
FIG. 14 is a perspective view illustrating an example of an ink jet recording apparatus according to an eighth embodiment.

In the eighth embodiment, as an application example, an ink jet recording apparatus as an example of a liquid drop discharge apparatus provided with the liquid drop discharge head 4 (See FIG. 13) will be explained. FIG. 14 is a perspective view illustrating an example of an ink jet recording apparatus according to the eighth embodiment. FIG. 15 is a side view illustrating an example of a mechanical section of the ink jet recording apparatus according to the eighth embodiment.

Referring to FIGS. 14 and 15, the ink jet recording apparatus 5, inside a recording apparatus main body 81, stores a carriage 93 movable in a main scanning direction and an ink jet recording head 94 as an embodiment of the liquid drop discharge head 4 mounted on the carriage 93. Moreover, the ink jet recording apparatus 5 stores a printing mechanism unit 83, including an ink cartridge 95 for supplying ink to the ink jet recording head 94 or the like, or the like.

In the lower part of the recording apparatus main body 81, a paper feed cassette 84 (or may be a paper feed tray) that can load a large number of papers 83 can be installed in a freely inserting/drawing manner. Moreover, a manual paper feed tray 85 for manually feeding paper 83 can be installed. The paper 83 fed from the paper feed cassette 84 or from the manual paper feed tray 85 is taken in, a required image is recorded by the printing mechanism unit 82, and is ejected to the paper ejection tray 86 installed on the rear face side.

The printing mechanism 82 holds the carriage 93 slidably in the main scanning direction by a main guide rod 91 and a sub guide rod 92 which are guide members laterally bridged on left and right side plates, which are not shown. On the carriage 93, the ink jet recording head 94 is installed wherein plural ink discharge ports (nozzles) are arranged in a direction intersecting with the main scanning direction and the direction for discharging ink droplets is directed downward. Meanwhile, the ink jet recording head 94 discharges ink droplets of respective colors of yellow (Y), cyan (C), magenta (M) and black (Bk). Moreover, on the carriage 93 the respective ink cartridges 95 for supplying ink of the respective colors to the ink jet recording head 94 are exchangeably installed.

The ink cartridge 95 has an air port, which is not shown, in communication with air on the upper side, and a supply port, which is not shown, for supplying ink to the ink jet recording head 94 on the lower side, and a porous body filled with ink, which is not shown, inside. According to the capillary force of the porous body, ink to be supplied to the ink jet recoding head 94 is maintained with a slightly negative pressure. Moreover, in the present embodiment, for the ink jet recording head 94, heads of the respective colors are used. However, a head having a nozzle that discharges the ink droplets of the respective colors may be used.

The carriage 93 is fitted into the main guide rod 91 slidably on the downstream side in the paper transportation direction and is placed on the sub guide rod 92 on the upstream side in the paper transportation direction. And, in order to move the carriage 93 for scanning in the main scanning direction, a timing belt is tensioned between a drive pulley 98 rotary driven by a main scanning motor 97 and a driven pulley 99, and the carriage 93 is reciprocally driven by positive and negative rotations. A timing belt 100 is fixed to the carriage 93.

Moreover, the ink jet recording apparatus 5 is provided with a paper feed roller 101 that separates a paper 83 from the paper feed cassette 84 and supplies the paper 83, a friction pad 102, a guide member 103 that guides the paper 83, and a transportation roller 104 that inverts the fed paper 83 and transports the paper 83. Furthermore, the ink jet recording apparatus 5 is provided with a transportation roller 105 pressed onto a periphery of the transportation roller 104 and a tip roller 106 that defines a sending angle for the paper 83 from the transportation roller 104. Accordingly, the paper 84 set in the paper feed cassette 84 is transported to the lower side of the ink jet recording head 94. The transportation roller 104 is rotary driven by a sub scanning motor 107 via an array of gears.

An imaging reception unit 109 which is a paper guide member, corresponding to the range of movement of the carriage 93 in the main scanning direction, guides the paper 83 sent from the transportation roller 104 on the lower side of the ink jet recording head 94. On the downstream side of the imaging reception unit 109 in the paper transportation direction, a transportation roller 111 and a spur 112 are provided for sending the paper 83 in the ejection direction. Furthermore, an ejection roller 113 and a spur 114 for sending the paper 83 to the ejection tray 86 and guide members 115 and 116 to form a paper ejection path are arranged.

Upon recording an image, by driving the ink jet recording head 94 according to an image signal while moving the carriage 93, ink is discharged on the paper 83 at rest, and one line is recorded. After transporting the paper 83 by a predetermined amount, the next line is recorded. By receiving a record end signal or a signal that a rear-end of the paper 83 reaches a recording region, the recording operation is finished and the paper 83 is ejected.

At a position on the right end side in the moving direction of the carriage 93 and outside the recording region, a restoration device 117 for restoring the ink jet recording head 94 from a discharging failure. The restoration device 117 includes a capping unit and a cleaning unit. The carriage 93, during waiting for printing, is moved on the side of the restoration device 117. The ink jet recording head 94 is capped by the capping unit, and the discharge port part is maintained wet, thereby a discharging failure due to a desiccation of ink is prevented. Moreover, in the middle of recording or the like, by discharging ink irrelevant to the recording, viscosities of the respective inks are kept constant, and a stable discharge performance is maintained.

In the case where a discharging failure occurs or the like, the discharge port of the ink jet recording head 94 is sealed tightly by the capping unit, and an air bubble or the like is sucked out with ink via a tube by a suction unit. Moreover, ink, dust or the like adhered to a surface of the discharge port is removed by the cleaning unit, and the discharging failure is eliminated. Furthermore, the sucked ink is ejected to a waste ink reservoir, which is not shown, installed in the lower part of the main body, and absorbed by an ink absorber and held.

In this way, on the ink jet recording apparatus 5, the ink jet recording heat 94 as an embodiment of the liquid drop discharge head 4 is installed. Accordingly, when there isn't an ink droplet discharge failure due to a driving failure in the vibration plate, a stable characteristic in discharging ink droplets can be obtained and an image quality can be enhanced.

As described above, the preferable embodiments have been explained in detail. Further, the present invention is not limited to these embodiments, but various variations and modifications may be made without departing from the scope of the present invention.

For example, in the embodiment, an example of using the SAM film as a mask that is thermally decomposed at a predetermined temperature. Instead of the SAM film, a resin film or the like that is thermally decomposed at a predetermined temperature may be used. An example of the resin film that is thermally decomposed at a predetermined temperature includes polyester, polycarbonate, polyurethane or the like.

Moreover, the electromagnetic wave to be shed is not limited to the laser light of continuous oscillation, but a laser light of pulse oscillation may be used. Moreover, the electromagnetic wave to be shed is not limited to the laser light, but any electromagnetic wave can be used if it can heat the electromagnetic absorption layer. For example, a flash lamp may be used.

Moreover, as an electromagnetic wave absorption layer, instead of the platinum film, other thermally-resistant films having a melting point greater than 1000° C. may be used. The other thermally-resistant films include, for example, a metallic film including any metal of Ir, Pd, Rh, W, Fe, Ni, Ta, Cr, Zr, Ti and Au. Moreover, the other thermally-resistant films include a metallic alloy film including an alloy of any metal of them, or includes a laminated film in which plural films arbitrarily selected from the above metallic films and from the metallic alloy films are laminated.

Moreover, for the supporting substrate, instead of the silicon substrate, a sapphire substrate may be used.

Moreover, the piezoelectric element according to the above embodiments can be used as a component part of the liquid droplet discharge head used in the ink jet recording apparatus or the like, as described above. But, the present invention is not limited to this. The piezoelectric element according to the above embodiments may be used as a component part of, for example, a micro pump, an ultrasonic motor, an acceleration sensor, a biaxial scanner for a projector, an infusion pump or the like.

The present application is based on and claims the benefit of priority of Japanese Priority Application No. 2013-189668 filed on Sep. 12, 2013, the entire contents of which are hereby incorporated by reference.

What is claimed is:

1. A pattern formation method comprising:
   forming an electromagnetic wave blocking structure having a region on a one side of a support substrate, a reflectance of an electromagnetic wave in the region being lower than a reflectance in an area outside the region;
   forming a mask layer provided with an opening corresponding to the region and configured to be thermally decomposed at a predetermined temperature on an other side of the support substrate;
   forming a first heated layer in the opening; and
   shedding an electromagnetic wave from the one side of the support substrate on the electromagnetic wave blocking structure, wherein an intensity of the electromagnetic wave is determined such that a temperature of the mask layer is less than the predetermined temperature and a temperature of the first heated layer being heated is greater than or equal to the predetermined temperature.

2. The pattern formation method as claimed in claim 1 further comprising forming an electromagnetic wave absorption layer on the other side of the support substrate and on a lower layer side of the mask layer, forming a heat distribution in the electromagnetic wave absorption layer by the electromagnetic wave shed from the one side of the support substrate on the electromagnetic wave blocking structure, and transferring the heat distribution to the first heated layer.

3. The pattern formation method as claimed in claim 2 wherein the first heated layer is formed such that the first heated layer is in direct contact with the electromagnetic wave absorption layer.

4. The pattern formation method as claimed in claim 1 wherein the electromagnetic wave blocking structure is an electromagnetic wave blocking layer provided with an opening in the region.

5. The pattern formation method as claimed in claim 1 wherein the electromagnetic wave blocking structure has a concave portion in the region formed on the one side of the support substrate.

6. The pattern formation method as claimed in claim 1 wherein the electromagnetic wave blocking structure is an optical film formed on the one side of the support substrate in the region or in the area outside the region, a refraction index of the optical film being different from a refraction index of the support substrate.

7. The pattern formation method as claimed in claim 1 further comprising:
laminating a second heated layer on the first heated layer which has been heated after shedding the electromagnetic wave; and
shedding an electromagnetic wave from the one side of the support substrate on the electromagnetic wave blocking structure, wherein an intensity of the electromagnetic wave is determined such that the temperature of the mask layer is less than the predetermined temperature and a temperature of the second heated layer being heated is greater than or equal to the predetermined temperature.

8. The pattern formation method as claimed in claim 1 wherein forming the mask layer includes forming the mask layer which is not provided with an opening and is configured to be thermally decomposed at the predetermined temperature on the other side of the support substrate; shedding an electromagnetic wave from the one side of the support substrate on the electromagnetic wave blocking structure; and forming the opening by setting the intensity of the electromagnetic wave shed from the one side of the support substrate on the electromagnetic wave blocking structure such that a temperature of a part of the mask layer being heated is greater than the predetermined temperature.

9. The pattern formation method as claimed in claim 1 wherein forming the mask layer includes forming a conductive oxide film patterned so as to correspond to the region in the electromagnetic wave blocking structure on the other side of the support substrate; and forming the mask layer in a region on the other side of the support substrate where the conductive oxide film is not formed, and a part where the conductive oxide film is formed corresponds to the opening.

10. A manufacturing method of a piezoelectric film comprising:
forming an electromagnetic wave blocking structure having a region on a one side of a support substrate, a reflectance of an electromagnetic wave in the region being lower than a reflectance in an area outside the region;
forming a lower electrode which is an electromagnetic wave absorption layer on an other side of the support substrate;
forming a mask layer provided with an opening corresponding to the region and configured to be thermally decomposed at a predetermined temperature on the lower electrode;
forming a complex oxide film, which is a piezoelectric film, in the opening on the lower electrode;
changing a crystalline characteristic of the complex oxide film by shedding an electromagnetic wave from the one side of the support substrate on the electromagnetic wave blocking structure such that a temperature of the mask layer is less than the predetermined temperature and a temperature of the complex oxide film is greater than or equal to the predetermined temperature to form a heat distribution in the lower electrode, and transferring the heat distribution to the complex oxide film; and
increasing a film thickness of the complex oxide film by repeating forming the complex oxide film and changing the crystalline characteristic of the complex oxide film.

11. The manufacturing method of a piezoelectric film as claimed in claim 10 wherein the electromagnetic wave blocking structure is an electromagnetic wave blocking layer provided with an opening in the region.

12. The manufacturing method of a piezoelectric film as claimed in claim 10 wherein the electromagnetic wave blocking structure has a concave portion in the region formed on the one side of the support substrate.

13. The manufacturing method of a piezoelectric film as claimed in claim 10 wherein the complex oxide film contains lead.

14. The manufacturing method of a piezoelectric film as claimed in claim 10 wherein the complex oxide film is a non-lead complex oxide film.

15. The manufacturing method of a piezoelectric film as claimed in claim 10 wherein changing the crystalline characteristic of the complex oxide film includes changing a non-crystalline complex oxide film to an $ABO_3$-type perovskite-type crystalline film.

16. A manufacturing method of a piezoelectric element comprising:
the manufacturing method of the piezoelectric film as claimed in claim 10; and
forming an upper electrode on the complex oxide film.

* * * * *

UNITED STATES PATENT AND TRADEMARK OFFICE
CERTIFICATE OF CORRECTION

| | | |
|---|---|---|
| PATENT NO. | : 9,583,694 B2 | Page 1 of 1 |
| APPLICATION NO. | : 14/479639 | |
| DATED | : February 28, 2017 | |
| INVENTOR(S) | : Xianfeng Chen | |

It is certified that error appears in the above-identified patent and that said Letters Patent is hereby corrected as shown below:

On the Title Page

Item (54) and in the Specification, at Column 1, Lines 1-5, replace the title with the following:
-- PATTERN FORMATION METHOD, MANUFACTURING METHOD OF PIEZOELECTRIC FILM AND MANUFACTURING METHOD OF PIEZOELECTRIC ELEMENT --.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*